United States Patent
Zhong et al.

(10) Patent No.: US 7,295,439 B2
(45) Date of Patent: Nov. 13, 2007

(54) HEAT SINK FASTENING ASSEMBLY

(75) Inventors: Yong Zhong, Shenzhen (CN); Bo-Yong Yang, Shenzhen (CN); Wan-Lin Xia, Shenzhen (CN)

(73) Assignees: Fu Zhun Precision Industry (Shenzhen) Co., Ltd., Bao'an District, Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 177 days.

(21) Appl. No.: 11/200,273

(22) Filed: Aug. 9, 2005

(65) Prior Publication Data

US 2006/0087818 A1  Apr. 27, 2006

(30) Foreign Application Priority Data

Oct. 23, 2004  (CN) .......................... 2004 2 0094440

(51) Int. Cl.
*H05K 7/20* (2006.01)
*H05K 1/14* (2006.01)

(52) U.S. Cl. ...................... 361/710; 361/709; 361/707; 361/704; 361/740

(58) Field of Classification Search ................ 361/704, 361/719, 710, 687, 709, 735, 742, 718, 712, 361/720, 702, 513, 707, 740; 257/719, 718, 257/727, 713, 706, 726; 165/80.3, 80.2, 165/185; 439/459; 411/508, 45, 41; 24/453, 24/458, 457, 467, 578.12, 580.11; 454/184
See application file for complete search history.

(56) References Cited

U.S. PATENT DOCUMENTS

| 4,692,304 | A  | * | 9/1987  | Gjertsen ..................... 376/446 |
| 4,760,495 | A  |   | 7/1988  | Till                                    |
| 6,039,523 | A  | * | 3/2000  | Kraus ........................... 411/48 |
| 6,307,748 | B1 | * | 10/2001 | Lin et al. ..................... 361/704 |
| 6,475,030 | B1 |   | 11/2002 | Chang                                   |
| 6,481,942 | B2 | * | 11/2002 | Tanaka ......................... 411/45  |
| 6,498,724 | B1 | * | 12/2002 | Chien .......................... 361/687 |
| 6,795,317 | B1 | * | 9/2004  | Liu ............................. 361/704 |
| 7,099,156 | B2 | * | 8/2006  | Chen et al. .................. 361/719   |
| 7,116,556 | B2 | * | 10/2006 | Lee et al. .................... 361/704  |
| 7,126,823 | B2 | * | 10/2006 | Chen et al. .................. 361/702   |
| 7,161,808 | B2 | * | 1/2007  | Atkinson ..................... 361/719   |
| 7,164,583 | B2 | * | 1/2007  | Lee et al. .................... 361/704  |
| 7,180,743 | B2 | * | 2/2007  | Chen et al. .................. 361/704   |

FOREIGN PATENT DOCUMENTS

TW  335925  1/1998

* cited by examiner

*Primary Examiner*—Lisa Lea-Edmonds
*Assistant Examiner*—Anthony M Haughton
(74) *Attorney, Agent, or Firm*—Morris Manning Martin LLP; TIm Tingkang Xia, Esq.

(57) ABSTRACT

A fastening assembly is for securing a heat sink to a heat generating electronic device located on a printed circuit board. The fastening assembly includes a first element and a second element slidably received in the first element. The first element includes a pressing portion, a plurality of outer flexible portions located below the pressing portion and a plurality of inner flexible portions integrally extending inwards from the outer flexible portions, respectively. The pressing portion of the first element presses downwardly the heat sink toward the electronic device. The outer flexible portions of the first element abut upwardly against the printed circuit board. The second element is capable of acting on the inner flexible portions of the first element to motivate the outer flexible portions to release their abutment from the printed circuit board.

17 Claims, 4 Drawing Sheets

HEAT SINK FASTENING ASSEMBLY

BACKGROUND

1. Field

The present invention relates generally to a fastening assembly for securing a heat sink to a printed circuit board, and more particularly to a fastening assembly used for fastening a heat sink to a printed circuit board wherein the fastening can be conveniently released.

2. Prior Art

With advancement of computer technology, electronic devices operate at high speed. It is well known that higher speed the electronic devices operate, more heat they generate. If the heat is not dissipated duly, the stability of the operation of the electronic devices will be impacted severely. Generally, in order to ensure the electronic device to run normally, a heat sink is used to dissipate the heat generated by the electronic device. Moreover, in order to keep the heat sink intimately contacting the electronic device, a fastening assembly is usually desired to secure the heat sink to the electronic device.

Nowadays, numerous fastening assemblies are used to secure heat sinks to electronic devices located on printed circuit board. Typically, a fastening assembly described as follows is used widely. The fastening assembly comprises a lengthwise shaft and a spring member attached to an end of the shaft. A retaining portion is formed at an opposite end of the shaft for engaging with the printed circuit board. The retaining portion comprises a left flexible portion, a right flexible portion and a longitudinal groove defined between the two portions for providing a deforming space to the two portions. In assembly, the retaining portion of the fastening assembly is inserted into a through hole defined in the heat sink and an aperture defined in the printed circuit board. Due to pressure of sidewalls of the hole and the aperture bearing on the retaining portion, the left flexible portion and the right flexible portion are deformed and shrink toward each other, and then pass through the hole and the aperture. Thereafter, the left flexible portion and the right flexible portion come back to their original positions where they are free. Here, the heat sink and the printed circuit board are sandwiched between the retaining portion and the spring member with the retaining portion abutting against the printed circuit board upwardly and the spring member pressing the heat sink toward the printed circuit board. Thus, the heat sink is intimately secured to the electronic device. However, a problem arises out when it comes to the detachment of the heat sink from the electronic device. A tool is desired to get the left flexible portion and the right flexible portion of the retaining portion shrunken toward each other so that the retaining portion can exit out of the aperture of the printed circuit board and the hole of the heat sink. At the present time, what is unfortunate is that space in the computer for the tool to work is more and more limited. Thus, it is inconvenient for the fastening assembly to be detached from the printed circuit board and the heat sink.

SUMMARY

Accordingly, what is needed is a fastening assembly which is convenient to secure/detach a heat sink to/from a circuit board.

A fastening assembly of an embodiment of the invention, for securing a heat sink to a heat generating electronic device located on a printed circuit board, comprises a first element and a second element slidably received in the first element. The first element comprises a first portion and a plurality of second portions extending from the first portion. The first portion comprises a pressing portion pressing the heat sink toward the electronic device. Each second portion comprises an outer flexible portion located below the pressing portion and an inner flexible portion integral with the outer flexible portion. The outer flexible portions of the second portions of the first element abut against the printed circuit board. The second element is capable of acting on the inner flexible portions of the second portions of the first element to motivate the inner and thereby the outer flexible portions to move toward a center of the first element. Therefore, the outer flexible portions release from their abutting against the printed circuit board as the second element moves toward the second portions of the first element.

Other advantages and novel features of the invention will become more apparent from the following detailed description when taken in conjunction with the accompanying drawings, in which:

DETAILED DESCRIPTION OF THE EMBODIMENT

Figure 1:
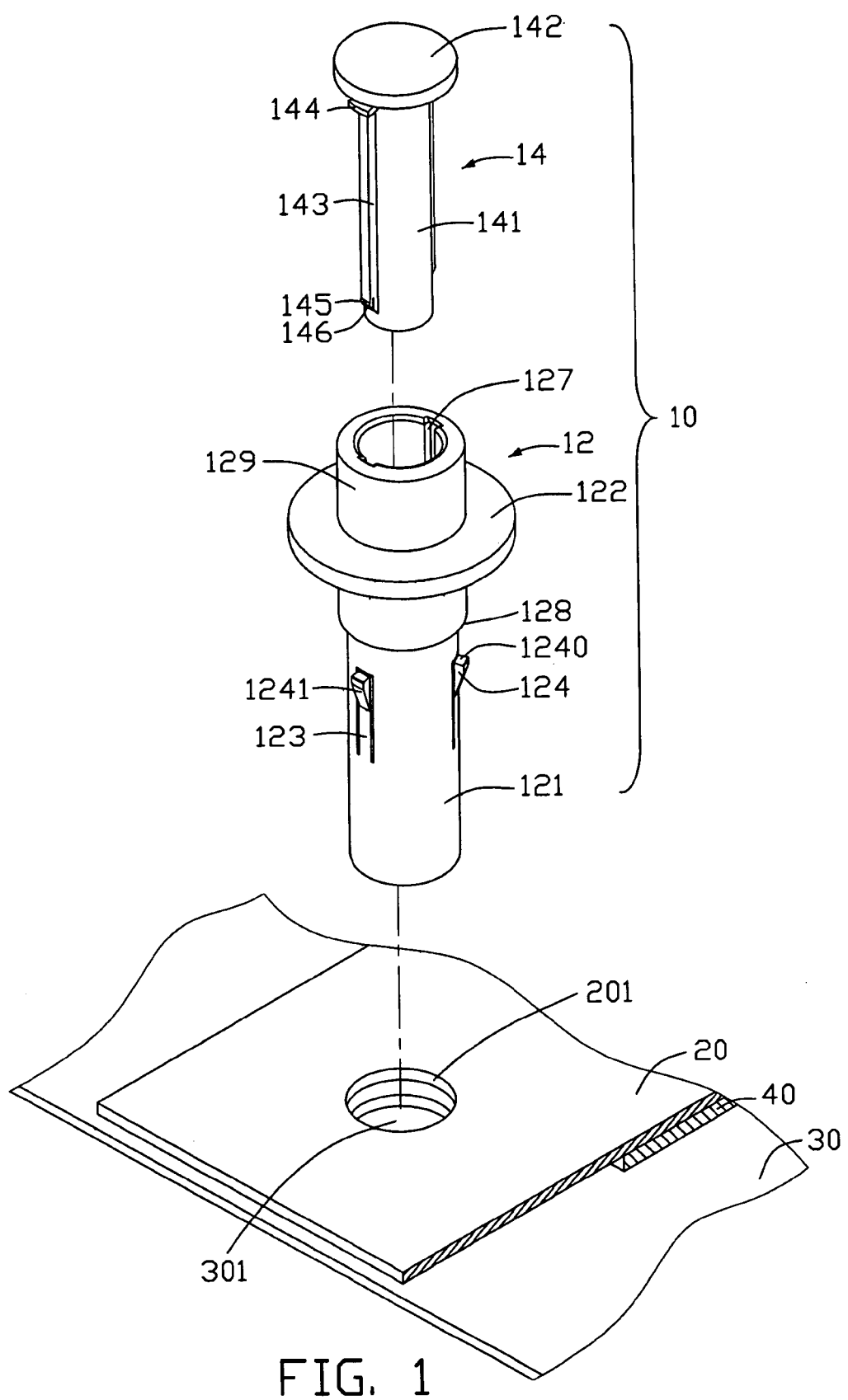
FIG. 1 is an exploded view of a fastening assembly with a heat sink, an electronic device and a printed circuit board.
Figure 2:
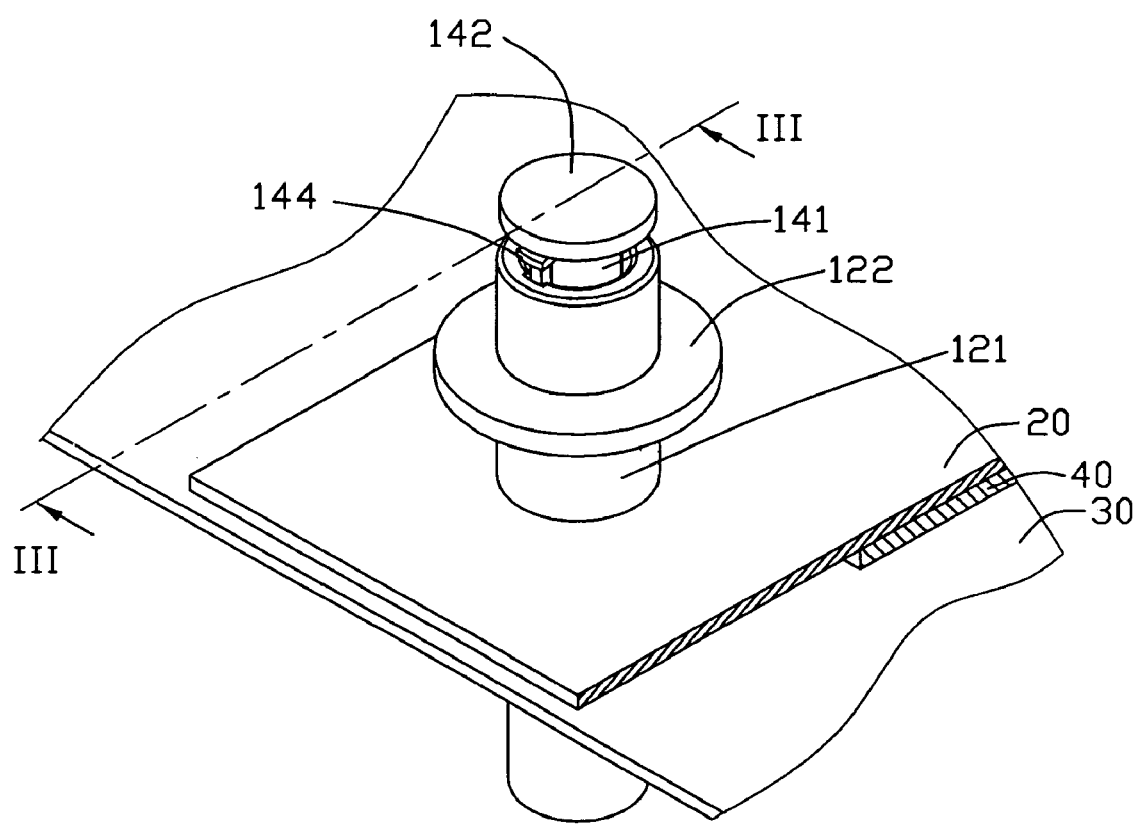
FIG. 2 is an assembled view of FIG. 1 wherein the fastening assembly is engaged with the heat sink and the printed circuit board.

FIGS. 1-2 show a fastening assembly 10 used for securing a heat sink 20 to an electronic device 40 mounted on a printed circuit board 30.

The printed circuit board 30 defines an aperture 301 therein for receiving the fastening assembly 10 therein. The heat sink 20 also defines a through hole 201 therein aligning with the aperture 301 of the printed circuit board 30 for receiving the fastening assembly 10 therein. It can be understood, at least two fastening assemblies 10 are desired to secure the heat sink 20 to the printed circuit board 30; it is apparent that amount of the aperture 301 of the printed circuit board 30 and the hole 201 of the heat sink 20 should be corresponding with that of the fastening assembly 10.

The fastening assembly 10 comprises a retaining member 12 for retaining the fastening assembly 10 to the printed circuit board 30 and a detaching member 14 for detaching the fastening assembly 10 from the printed circuit board 30 and the heat sink 20. The detaching member 14 is slidablely received in the retaining member 12.

The retaining member 12 comprises a hollow body 121, and a circular shoulder 122 around the body 121 and integral with the body 121 for operating thereon to attach the retaining member 12 to the heat sinik 20 and the printed circuit board 30. The shoulder 122 has an outer diameter larger than that of other portion of the retaining member 12. The body 121 comprises an expanding head 129 above the shoulder 122, and an expanding pressing portion 128 beneath the shoulder 122 for pressing the heat sink 20 toward the printed circuit board 30 after the fastening assembly 10 is fastened to the printed circuit board 30. The pressing portion 128 has an outer diameter smaller than that of the shoulder 122. On the body 121, three flexible portions 123 are formed at a distance beneath the pressing portion 128. Of course, the amount of the flexible portions 123 is not limited, it also can be two, four or other number. Each flexible portion 123 extends upwardly from the body 121 and integrates with the body 121 at a bottom end thereof. Each flexible portion 123 comprises a sphenoid retaining portion 124 projecting outwardly of the body 121 and a beam 125 integrating with an inside of the retaining portion 124 and located in the body 121. The retaining portion 124 has a top abutting face 1240 and a slantwise guiding face 1241 at an outside thereof, slanting inwardly along op-to-bottom direction for facilitating the retaining portion 124 to be downwardly inserted into the hole 201 of the heat sink 20 and the aperture 301 of the printed circuit board 30. An angle (not labeled) is formed at a joint of the abutting face 1240 and the guiding face 1241 for facilitating the fastening assembly 10 to be attached/detached to/from the circuit board 30 and the heat sink 20. The beam 125 extends upwardly and formed a tab 126 at a top end thereof, wherein the tab 126 is located above the retaining portion 124. The beam 125 and the body 121 define a space therebetween for the detaching member 14 to move therein. Two longitudinal passageways 127 are defined in an inner face of the body 121 along an axial direction of the body 121. Each passageway 127 begins at the upper end of the body 121 and terminates at a position beneath the tab 126.

The detaching member 14 is slidably received in the retaining member 12. The detaching member 14 comprises a shaft 141, a head 142 above the shaft 141 for operating thereon to move the detaching member 14 relative to the retaining member 12, and a narrow neck (not labeled) between the shaft 141 and the head 142. The head 142 has a diameter larger than that of other portion of the detaching member 14. Two longitudinal bulges 143 are formed on a periphery of the shaft 14 for sliding in the passageways 127 of the retaining member 14. A block 144 extends outwardly from a top end of each bulge 143 for preventing the detaching member 14 from sinking into the retaining member 14. Each bulge 143 at a bottom end thereof forms a barb 145 for flexibly abutting against the inner face of the body 121 of the retaining member 12 to prevent the detaching member 14 from easily sliding out of the retaining member 12. A longitudinal slit 146 is defined in the bottom end of the bulge 143 beside the barb 145 for increasing the flexibility of the barb 145. The shaft 141 at a bottom end thereof is hollowed to define a cone-shaped room 147 therein which has a narrow upper end, a wide bottom end and a slant face between the two ends. Three guiding channels 148 are defined in the slant face of the room 147, for engagingly receiving with the tabs 126 of the retaining member 12, respectively.

Figure 3:
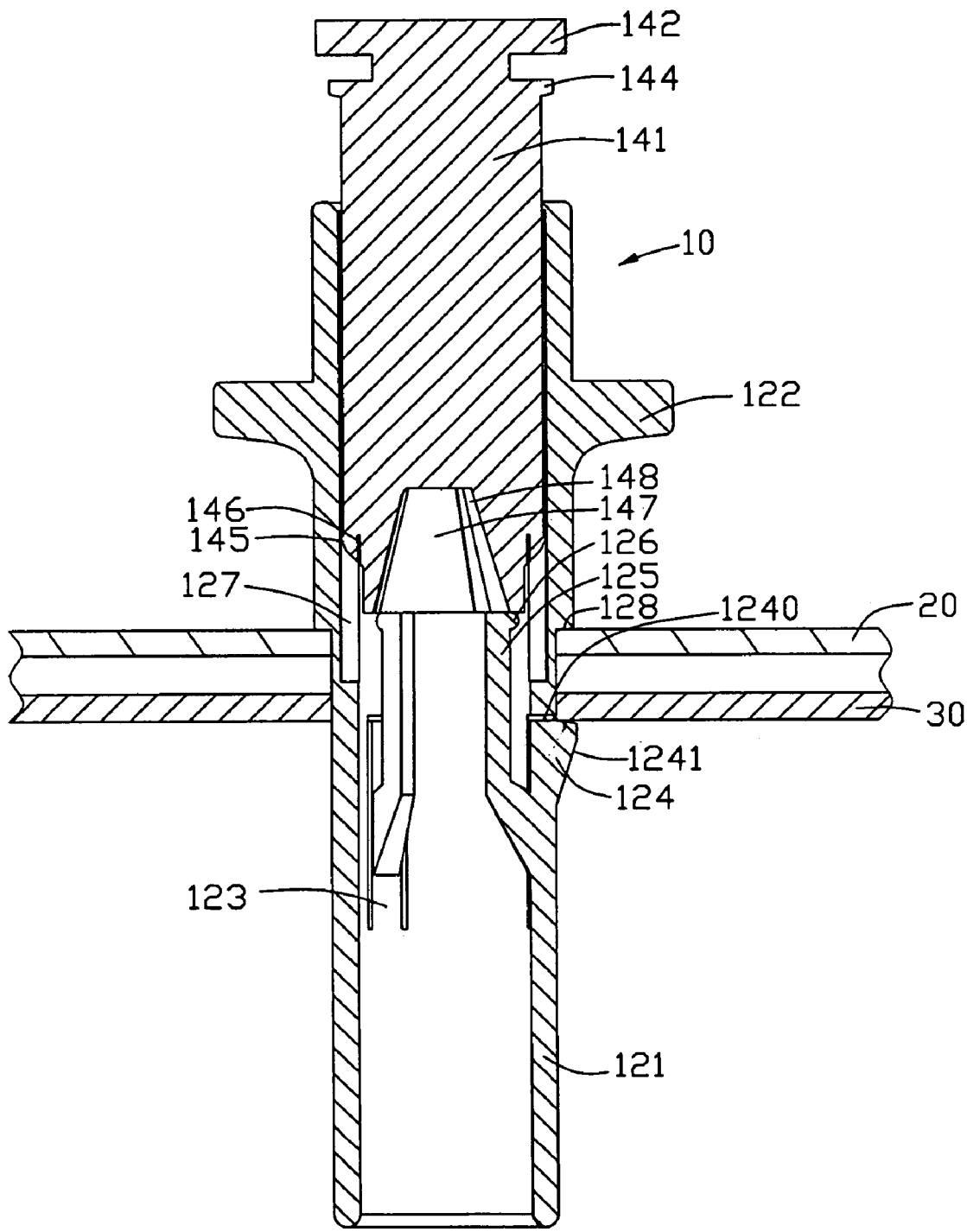
FIG. 3 is a cross-sectional view taken along line III-III of FIG. 2.

With reference to FIG. 3, when the fastening assembly 10 is used to secure the heat sink 20 to the printed circuit board 30 so that the heat sink 20 can thermally contact with the electronic device 40, the body 121 of the retaining member 12 is inserted into the hole 201 of the heat sink 20 and the aperture 301 of the printed circuit board 30 under a press on the shoulder 122 of the retaining member 12. Since the guiding face 1241 of the retaining portion 124 is pressed by inner faces of the hole 201 and the aperture 201, the insertion of the retaining member 12 can be easily manipulated to reach a position in which the heat sink 20 and the printed circuit board 30 are sandwiched between the abutting face 1240 of the retaining portion 124 and a bottom face of the pressing portion 128. Here, the abutting face 1240 abuts against a bottom face of the printed circuit board 30 upwardly around the aperture 301. A bottom face of the pressing portion 128 presses the heat sink 20 toward the electronic device 40 around the hole 201. Thus, the fastening assembly 10 is attached to the printed circuit board 30 and the heat sink 20 is intimately secured to the electronic device 40.

Figure 4:
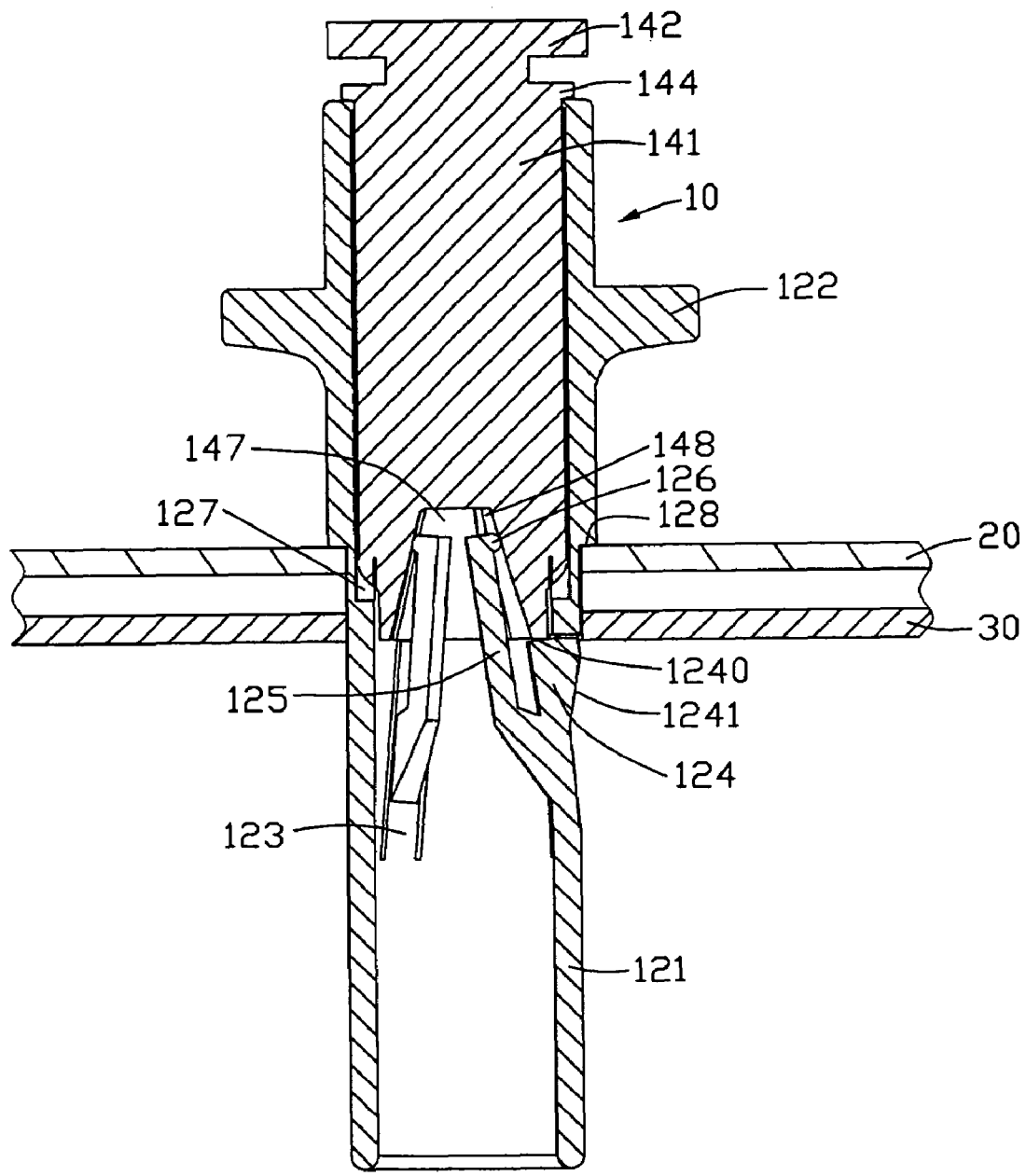
FIG. 4 is a view similar to FIG. 3, but a detaching member is operated to release a lock between a retaining member of the fastening assembly and the printed circuit board.

With reference to FIG. 4, detachment of the fastening assembly 10 from the printed circuit board 30 is illustrated. Under a pressing force on the head 142 of the detaching member 14, the shaft 141 of the detaching member 14 moves downwards into the retaining member 12 via the bulges 143 sliding in the passageways 127 of the retaining member 12. When the bottom end of the shaft 141 slides into the space between the body 121 and the beam 125, the tabs 126 enter into the guiding channels 148 of the shaft 141 and move along the guiding channels 148 from the wide lower end to the narrow upper end of the room 147 of the shaft 141. Because of the cone-shaped configuration of the room 147, the beams 125 deform toward a center of room under a pressure of the slant face of the room 147 bearing on the tabs 126. The inward movement of the beams 125 pulls the retaining portions 124 to also have an inward movement, such that the retaining portions 124 leave their engagement with the printed circuit board 30 to reach a location under the aperture 301 of the printed circuit board 30. As a result, the retaining members 12 can be detached out of the aperture 301 of the printed circuit board 30 and the hole 201 of the heat sink 20. When the retaining member 12 is disengaged from the printed circuit board 30 and the heat sink 20, the heat sink 20 can be removed from the electronic device 40.

According to the above embodiment of the invention, the retaining member 12 of the fastening assembly 10 has the pressing portion 128 and the retaining portions 124 which can sandwich the heat sink 20 and the printed circuit board 30 therebetween after the retaining member 12 is inserted into the hole 201 of the heat sink 20 and the aperture 301 of the printed circuit board 30 under a pressure; thus, the heat sink 20 is intimately secured to the electronic device 40. The fastening assembly 10 has the detaching member 14 slidably received in the retaining member 12. When the detaching member 14 slides into the retaining member 12 under a pressure on the head 142 of the detaching member 14, the beams 125 of the retaining member 14 can be moved inwardly in the cone-shaped room 147 and moves toward the center of the room 147 under the pressure from the slant face of the room 147. Due to the retaining portions 124 integrating with the beams 125, the inward movement of the beams 125 pulls the retaining portions 124 such that the retaining portions 124 move inwardly from a position where the retaining portions 124 abut against the printed circuit board 30 to a position where the retaining portions 124 are located under the aperture 301 of the printed circuit board 30 and escape from their engagement with the printed circuit board 30. Thus, the fastening assembly 10 can be detached from the printed circuit board 30 via the retaining member 12 being moved out of the aperture 301 of the printed circuit board 30 and the hole 201 of the heat sink 20. Thus, the heat sink 20 can be removed from the electronic device 40. So, it is convenient to secure the heat sink 20 to the electronic device 40 via pressing the retaining member 12 of the fastening assembly 10, and remove the heat sink 20 from the electronic device 40 via pressing the detaching member 14 of the fastening assembly 10.

It is to be understood, however, that even though numerous characteristics and advantages of the present invention have been set forth in the foregoing description, together with details of the structure and function of the embodiment, the disclosure is illustrative only, and changes may be made in detail, especially in matters of shape, size, and arrangement of parts within the principles of the invention to the full extent indicated by the broad general meaning of the terms in which the appended claims are expressed.

We claim:

1. A fastening assembly comprising:
a first element comprising a first portion and a plurality of second portions extending from the first portion, each of the second portions comprising an outer member collaborative with the first portion to sandwich two devices therebetween so that the two devices are fastened together and an inner member integrating with the outer member; and
a second element slidably received in the first element and being capable of acting on the inner members of the second portions of the first element to motivate the outer members to move away and escape from the fastened devices as the second element moves toward the second portions of the first element;
wherein the second element defines a room at a bottom end thereof, and the inner members of the first element are received in the room.

2. The fastening assembly of claim 1, wherein the first portion is a hollow body, the outer member of each of the second portions is sphenoid and projects out of the body, the inner member of each of the second portions is located in the body.

3. The fastening assembly of claim 2, wherein the first portion has a pressing portion located above the second portions and collaborative with the second portions to sandwich the fastened devices therebetween.

4. The fastening assembly of claim 1, wherein the room of the second element is cone-shaped and has a narrow upper end, a wide bottom end and a slant face between the two ends.

5. The fastening assembly of claim 4, wherein the slant face of the room defines a plurality of channels therein, and wherein the inner member of each of the second portions of the first element forms a tab at a distal end thereof, the tab is slidably received in the channel and pulls the outer member of each of the second portions toward a center of the first element when the second element moves toward the second portions of the first element.

6. The fastening assembly of claim 3, wherein the second element comprises a shaft forming a plurality of longitudinal bulges on a periphery thereof, and wherein the first portion of the first element defines a plurality of longitudinal passageways in an inner face thereof, the bulges being slidably received in the passageways respectively.

7. The fastening assembly of claim 6, wherein each of the bulges of the shaft has a block formed at an end thereof which projects beyond the first portion of the first element, and a barb formed at an opposite end thereof which is flexibly abutting against the inner face of the first portion.

8. The fastening assembly of claim 7, wherein each of the bulges defines a slit beside the barb.

9. The fastening assembly of claim 3, wherein the second element has a head at a top end thereof, the head having a diameter larger than that of other portion of the second element.

10. The fastening assembly of claim 3, wherein the first element comprises a shoulder above the pressing portion, the shoulder having an outer diameter larger than that of other portion of the first element.

11. A combination comprising:
a printed circuit board;
an electronic device mounted on the printed circuit board;
a heat sink securable on the electronic device; and
a fastener comprising a first element and a second element slidably received in the first element, the first element comprising a pressing portion pressing the heat sink toward the electronic device, a plurality of outer portions distant from the pressing portion and a plurality of inner portions integrally extending from the outer portions, respectively, the outer portions of the first element abutting upward against the printed circuit board toward the heat sink, wherein when the second element slides in the first element toward the inner portions, the inner portions are moved by the second element to drive the outer portions to leave their abutment with the printed circuit board;
wherein the second element defines a room in a distal end thereof the room has a slant face at a circumference thereof, the inner portions of the first element are slidably received in the room; and
wherein the slant face of the second element defines a plurality of guiding channels therein, and wherein each of the inner portions of the first element forms a tab at a distal end thereof, the tab sliding in the guiding channel relative to the second element and pulling the outer portions such that the outer portions release from their abutting against the printed circuit board when the second element slides into the first element under a pressure.

12. The combination of claim 11, wherein the printed circuit board defines an aperture beside the electronic device, the first element being received in the aperture and the outer portions abutting against the printed circuit board around the aperture, and wherein the heat sink defines a hole aligned with the aperture of the printed circuit board, the first element being received in the hole and the pressing portion pressing the heat sink around the hole.

13. The combination of claim 12, wherein the first element comprises a body received in the hole of the heat sink and the aperture of the printed circuit board, the outer portions extend from the body and project out of the body, and wherein each of the outer portions has a top face abutting against the printed circuit board, and a slant face extending downwardly toward a center of the first element.

14. A fastening assembly for securing a heat sink to a printed circuit board so that an electronic device on the printed circuit board can have a thermal contact with the heat sink, comprising:
a first member inserted into the heat sink and the printed circuit board, having a pressing portion pressing downwardly the heat sink toward the printed circuit board, a first flexible portion engaging the printed circuit board and exerting an upward force on the printed circuit board toward the heat sink around a hole of the printed circuit board, and a second flexible portion integral with the first flexible portion;
a second member having a bottom end defining a room, the second member being mounted on the first member and moveable relative to the first member between first and second positions, the room receiving the second flexible portion of the first member, the second member motivating the second and accordingly the first flexible portion to move toward a center of the first member to reach a position that the engagement between the first flexible portion and the printed circuit board is released and the first flexible portion is located under the hole of the printed circuit board when the second member moves from the first and the second position.

15. The fastening assembly of claim 14, wherein the first member defines a plurality of passageways therein, and the second member forms a plurality of bulges fitting in the passageways, respectively.

16. The fastening assembly of claim 14, wherein the room of the second member having a cone-shaped configuration with a narrow upper end and a wide lower end.

17. The fastening assembly of claim 14, wherein the second member moves from the first to the second position by moving toward the first member.

* * * * *